United States Patent
Utomo et al.

(10) Patent No.: US 7,863,653 B2
(45) Date of Patent: Jan. 4, 2011

(54) METHOD OF ENHANCING HOLE MOBILITY

(75) Inventors: Henry K. Utomo, Newburgh, NY (US); Judson R. Holt, Wappingers Falls, NY (US); Haining S. Yang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 620 days.

(21) Appl. No.: 11/561,496

(22) Filed: Nov. 20, 2006

(65) Prior Publication Data

US 2008/0116484 A1  May 22, 2008

(51) Int. Cl.
  *H01L 27/10* (2006.01)
(52) U.S. Cl. ............ 257/204; 257/275; 257/351; 257/371; 257/E27.062
(58) Field of Classification Search ............ 257/204, 257/275, 351, 371
  See application file for complete search history.

(56) References Cited

U.S. PATENT DOCUMENTS

| 6,995,456 | B2* | 2/2006 | Nowak ............... 257/627 |
| 2005/0136584 | A1* | 6/2005 | Boyanov et al. ........ 438/199 |
| 2005/0230676 | A1* | 10/2005 | Bae et al. ............... 257/19 |
| 2006/0151837 | A1 | 7/2006 | Chen et al. |
| 2006/0175659 | A1 | 8/2006 | Sleight |
| 2006/0194384 | A1 | 8/2006 | Venkatesan et al. |
| 2006/0194421 | A1 | 8/2006 | Ieong et al. |

FOREIGN PATENT DOCUMENTS

| CN | 1322016 A | 11/2001 |
| CN | 1667828 A | 9/2005 |

\* cited by examiner

*Primary Examiner*—Wai-Sing Louie
(74) *Attorney, Agent, or Firm*—Gibb I.P. Law Firm, LLC; Ian D. McKinnon, Esq.

(57) ABSTRACT

A semiconductor device is provided comprising an oxide layer over a first silicon layer and a second silicon layer over the oxide layer, wherein the oxide layer is between the first silicon layer and the second silicon layer. The first silicon layer and the second silicon layer comprise the same crystalline orientation. The device further includes a graded germanium layer on the first silicon layer, wherein the graded germanium layer contacts a spacer and the first silicon layer and does not contact the oxide layer. A lower portion of the graded germanium layer comprises a higher concentration of germanium than an upper portion of the graded germanium layer, wherein a top surface of the graded germanium layer lacks germanium.

11 Claims, 7 Drawing Sheets

METHOD OF ENHANCING HOLE MOBILITY

BACKGROUND

1. Field of the Invention

The embodiments of the invention provide a device, method, etc. for enhancing hole mobility.

2. Description of the Related Art

Forming p-type field effect transistors (pFETs) on a (110) crystalline-oriented substrate will double hole mobility. However, electron mobility is degraded as much if n-type field effect transistors (nFETs) are formed on the (110) crystalline-oriented substrate. Hence, a hybrid-oriented substrate is typically needed in order to gain an overall performance benefit by forming the pFETs on (110) crystalline-oriented planes and the nFETs on (100) crystalline-oriented planes. In order to obtain a hybrid-oriented substrate, a (100) crystalline-oriented wafer could be bound with a (110) crystalline-oriented wafer. This approach will most likely be more expensive than a current (100) crystalline-oriented silicon-on-insulator (SOI) that can be formed by either bonding two (100) crystalline-oriented wafers or by a separation by implantation of oxygen (SIMOX) technique.

SUMMARY

The embodiments of the invention provide a device, method, etc. for enhancing hole mobility. More specifically, a semiconductor device comprises an oxide layer over a first silicon layer and a second silicon layer over the oxide layer, wherein the oxide layer is between the first silicon layer and the second silicon layer. The first silicon layer and the second silicon layer comprise the same crystalline orientation. An area is provided on the first silicon layer, wherein the area contacts the oxide layer, the first silicon layer, and the second silicon layer. The area comprises a spacer, a shallow trench isolation region, or a field oxide region.

The device further includes a graded germanium layer on the first silicon layer, wherein the graded germanium layer contacts the area and the first silicon layer and does not contact the oxide layer. A lower portion of the graded germanium layer comprises a higher concentration of germanium than an upper portion of the graded germanium layer, wherein a top surface of the graded germanium layer lacks germanium.

Additionally, an nFET is over the second silicon layer and a pFET is over the graded germanium layer, wherein the oxide layer is only below the nFET and is not below the pFET. The nFET and the pFET are on the same plane.

The device could also include a third silicon layer over the graded germanium layer, wherein the pFET is over the third silicon layer. Thus, the third silicon layer is between the graded germanium layer and the pFET. The third silicon layer comprises strained pseudomorphic silicon.

A method is also provided comprising forming an oxide layer over a first silicon layer and forming a second silicon layer over the oxide layer such that the oxide layer is between the first silicon layer and the second silicon layer. The second silicon layer is also formed such that the second silicon layer and the first silicon layer comprise the same crystalline orientation. Next, a portion of the second silicon layer and a portion of the oxide layer are removed to leave an exposed area of the first silicon layer.

Following this, an area is formed on the exposed area of the first silicon layer such that the area contacts the oxide layer, the first silicon layer, and the second silicon layer. The area comprises a spacer, a shallow trench isolation region, or a field oxide region.

The method then forms a graded germanium layer on the exposed area of the first silicon layer such that the graded germanium layer contacts the area and the first silicon layer. Moreover, the graded germanium layer is formed such that a lower portion of the graded germanium layer comprises a higher concentration of germanium than an upper portion of the graded germanium layer, and such that a top surface of the graded germanium layer lacks germanium.

Subsequently, an nFET is formed over the second silicon layer and a pFET is formed over the graded germanium layer, such that the oxide layer is only below the nFET and is not below the pFET. The nFET and the pFET are formed on the same plane. The method could also include forming a third silicon layer over the graded germanium layer such that the third silicon layer comprises strained pseudomorphic silicon.

Accordingly, the embodiments of the invention build the pFET on silicon on germanium and the nFET on the SOI substrate. Doing this will give the benefit of using a (100) crystalline-oriented SOI substrate, enhancing pFET carrier mobility and keeping the SOI benefit on nFET.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
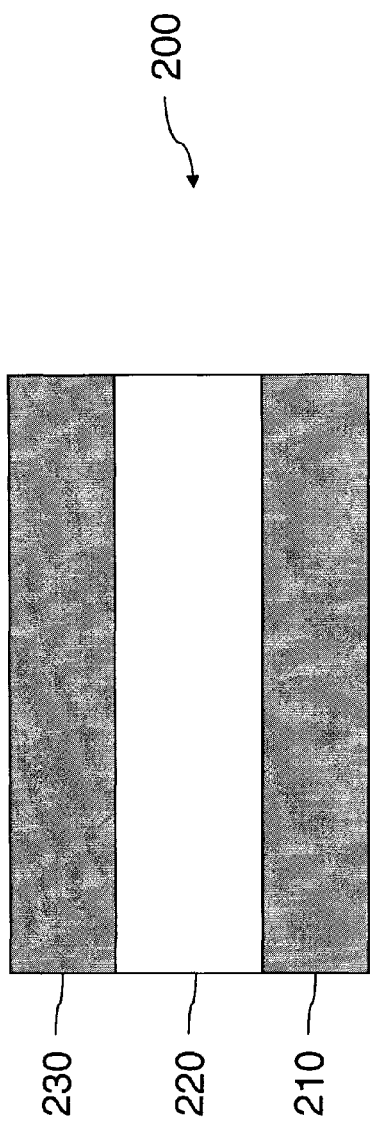
FIG. 1 illustrates a diagram of an oxide layer between first and second silicon layers.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention build the pFET on silicon germanium and the nFET on the SOI substrate. Doing this will give the benefit of using a (100) crystalline-oriented SOI substrate, enhancing pFET carrier mobility and keeping the benefit of having the nFET on the SOI substrate.

Hole mobility can be enhanced by six times by using single crystal germanium for the p channel. To have this on an SOI substrate, graded silicon germanium can be deposited on silicon to have 100% germanium crystal on the surface. This will have <100> crystalline oriented silicon for an nFET and germanium for a pFET. Details of similar structures are described in United States Patent Application Publication No. 2006/0175659 to Sleight, United States Patent Application Publication No. 2006/0194384 to Venkatesan et al., and United States Patent Application Publication No. 2006/0194421 to Teong et al., which are fully incorporated herein by reference.

As illustrated in FIG. 1, a method of enhancing hole mobility begins with an SOI substrate 200. More specifically, a buried oxide (BOX) layer (also referred to herein as the "oxide layer") 220 is formed on a first silicon layer 210; and, a second silicon layer 230 is formed on the oxide layer 220. The first silicon layer 210 and the second silicon layer 230 comprise the same crystalline orientation. For example, the first silicon layer 210 and the second silicon layer 230 could each comprise a <100> crystalline orientation.

Figure 2:
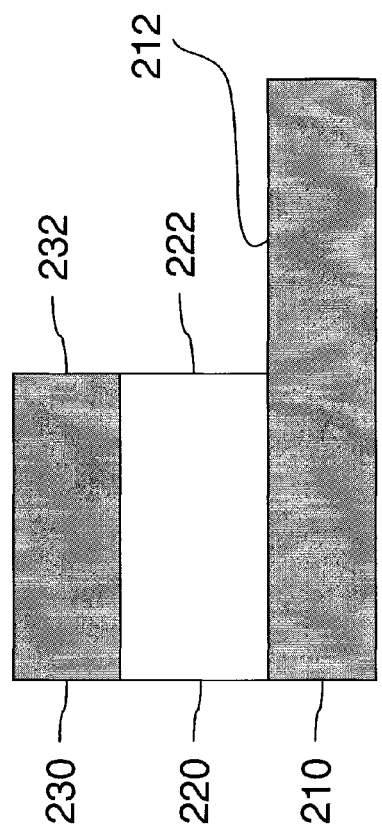
FIG. 2 illustrates a diagram of an exposed area of the first silicon layer.

Next, as illustrated in FIG. 2, portions of the second silicon layer 230 and the oxide layer 220 are removed to leave an exposed area 212 of the first silicon layer 210. A sidewall 232 of the second silicon layer 230 and a sidewall 222 of the oxide layer 220 are adjacent to the exposed area 212 of the first silicon layer 210, wherein the sidewall 232 is collinear to the sidewall 222. Moreover, the removed portion of the second silicon layer 230 could have a surface area that is equal to the surface area of the removed portion of the oxide layer 220.

Figure 3:
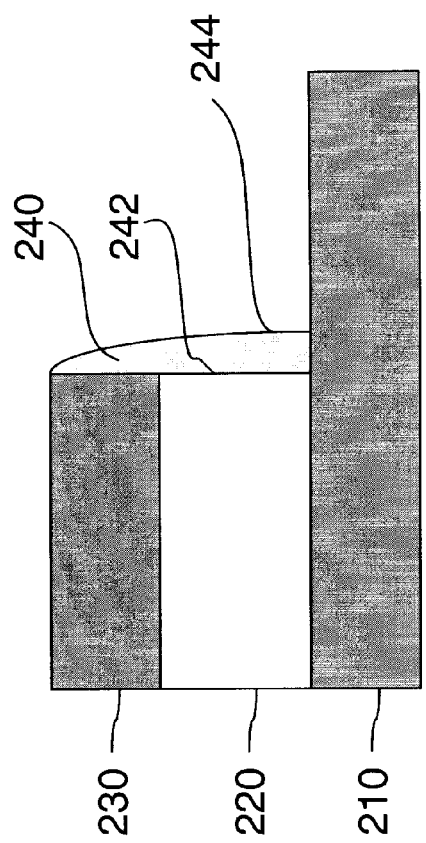
FIG. 3 illustrates a diagram of an area on the exposed area of the first silicon layer.

Following this, as illustrated in FIG. 3, an area 240 is formed on the exposed area 212 of the first silicon layer 210, wherein the area 240 comprises a spacer, for example an oxide or nitride spacer. The area (also referred to herein as the "spacer") 240 includes a straight first side 242 and a curved second side 244. The first side 242 of the spacer 240 is on the sidewalls 222 and 232 of the oxide layer 220 and the second silicon layer 230, respectively. Furthermore, a height of the spacer 240 is approximately equal to the combined height of the oxide layer 220 and the second silicon layer 230.

Figure 4:
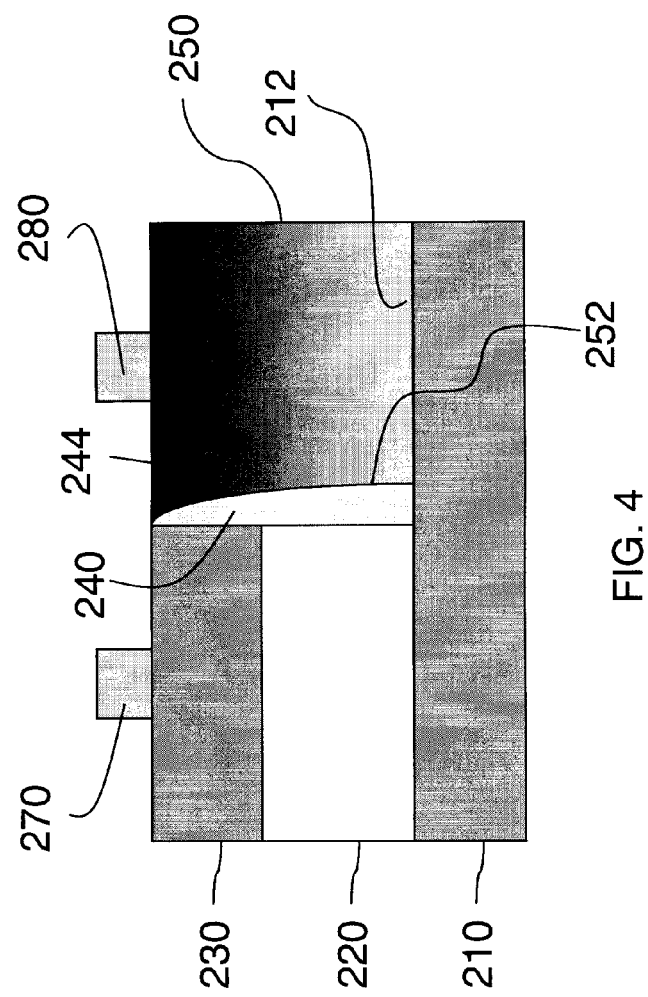
FIG. 4 illustrates a diagram of a graded germanium layer on the exposed area of the first silicon layer.

As illustrated in FIG. 4, the method then forms a graded germanium layer 250 on the exposed area 212 of the first silicon layer 210. A first side 252 of the graded germanium layer 250 is on the second side 244 of the spacer 240. Moreover, a height of the graded germanium layer 250 is approximately equal to the combined height of the oxide layer 220 and the second silicon layer 230. Subsequently, an nFET 270 is formed on the second silicon layer 230; and, a pFET 280 is formed on the graded germanium layer 250.

Combined fabrication of nFET on silicon and pFET on germanium can be difficult due to the properties of germanium. In order to have common processes for N and P type transistors, single crystal silicon can be deposited on top of the germanium to form pseudomorphic silicon on germanium. This layer of silicon will then be used to form the p channel. Details of similar structures are described in United States Patent Application Publication No. 2006/0151837 to Chen et al., which is fully incorporated herein by reference.

Figure 5:
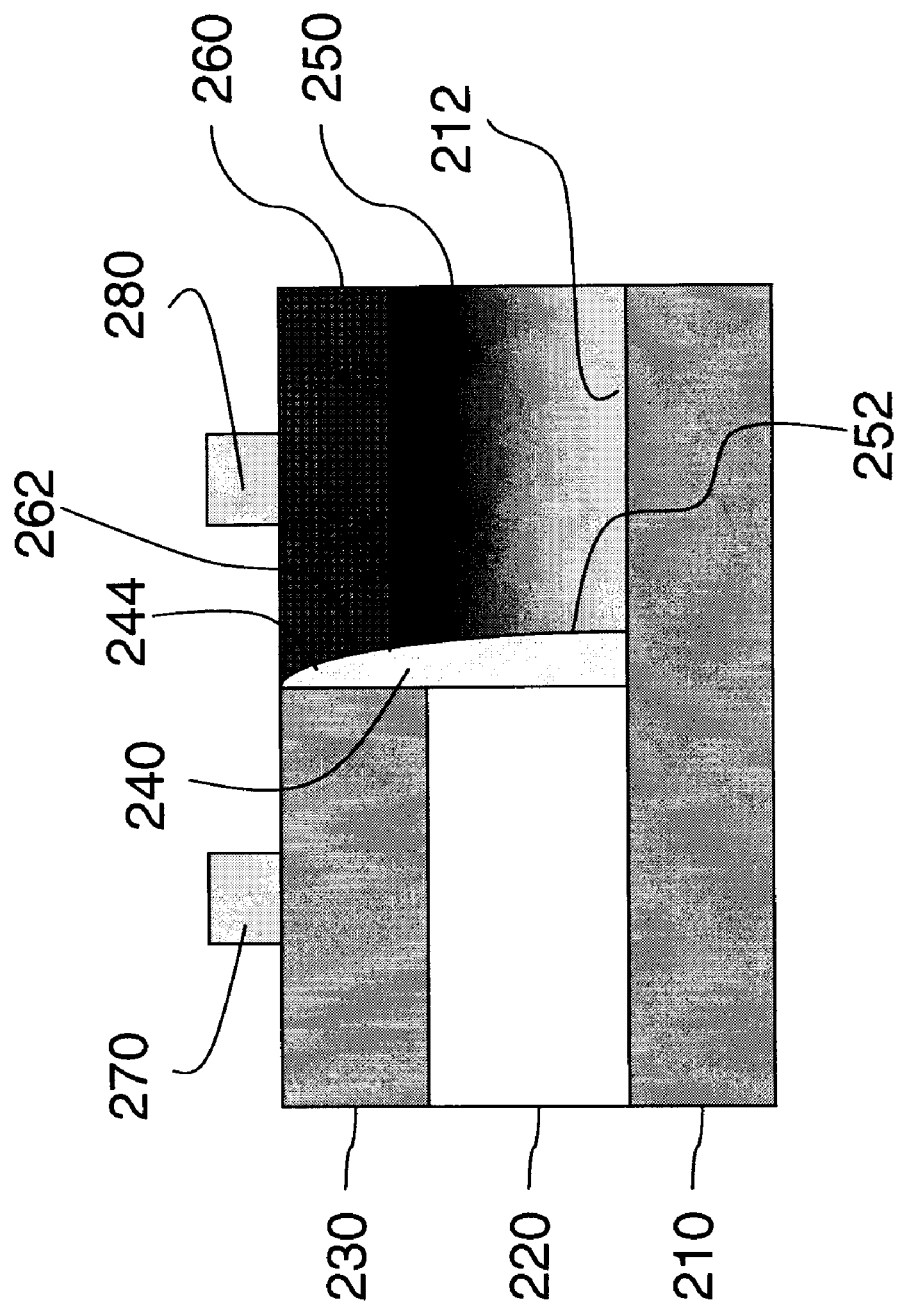
FIG. 5 illustrates a diagram of a third silicon layer on the exposed area of the graded germanium layer.

As illustrated in FIG. 5, a third silicon layer 260 can be formed in an upper portion of the graded germanium layer 250. A first side 262 of the third silicon layer 260 is on the second side 244 of the spacer 240. Further, a combined height of the graded germanium layer 250 and the third silicon layer 260 is approximately equal to the combined height of the oxide layer 220 and the second silicon layer 230. Thus, the pFET 280 could be formed on the third silicon layer 260.

Additionally, the third silicon layer 260 includes strained pseudomorphic silicon. Specifically, a thin layer of single-crystal silicon is provided with built-in strain (stress) to accelerate electrons, thus allowing the manufacture of faster devices. Moreover, the third silicon layer 260 is a lattice-mismatched heterostructure. In other words, a layer of single-crystal material on a single-crystal substrate is provided featuring slightly different chemical composition, and hence, a slightly different lattice constant. Lattice mismatch is accommodated by strain in the film; and, thinner than certain critical thickness ($h_c$) above which stress in the film is released by formation of dislocation.

Figure 6A:
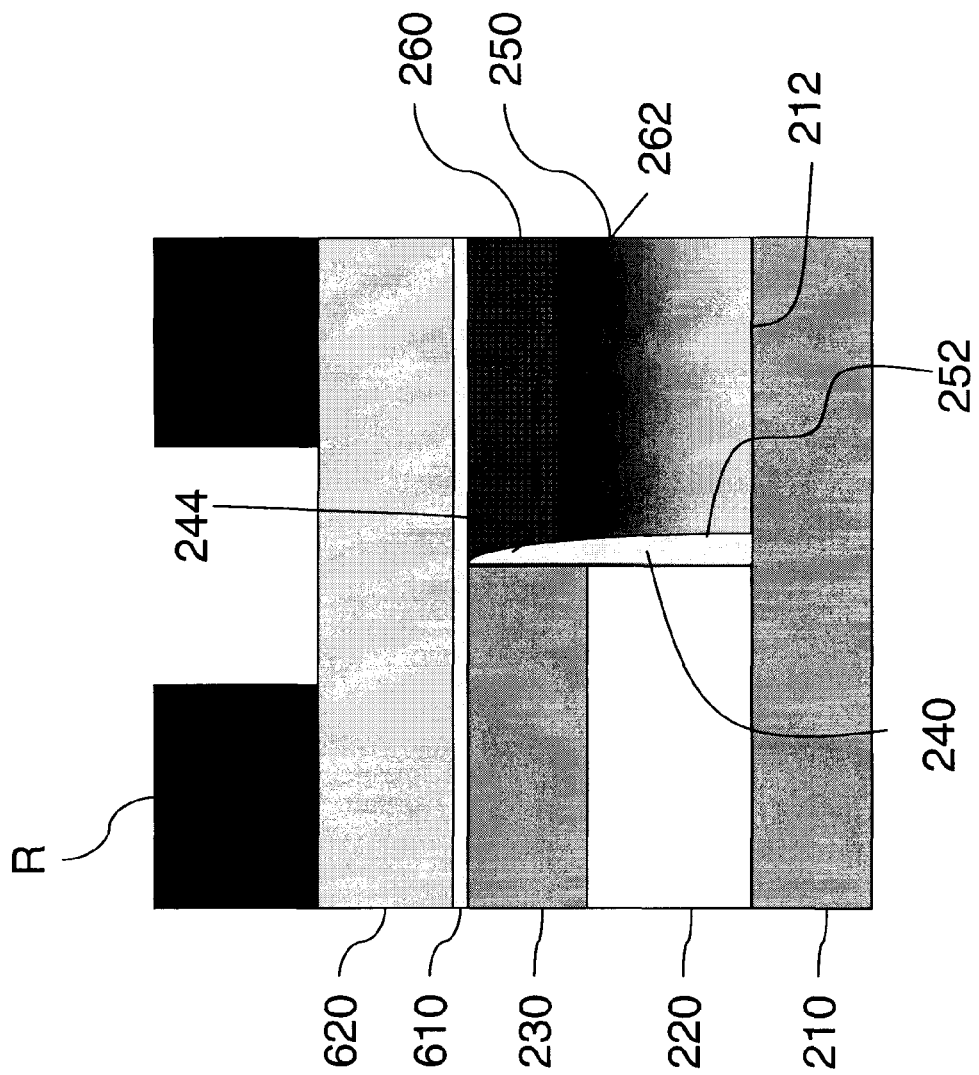
FIG. 6A illustrates a diagram of a pad oxide layer, a pad nitride layer, and resists.
Figure 6B:
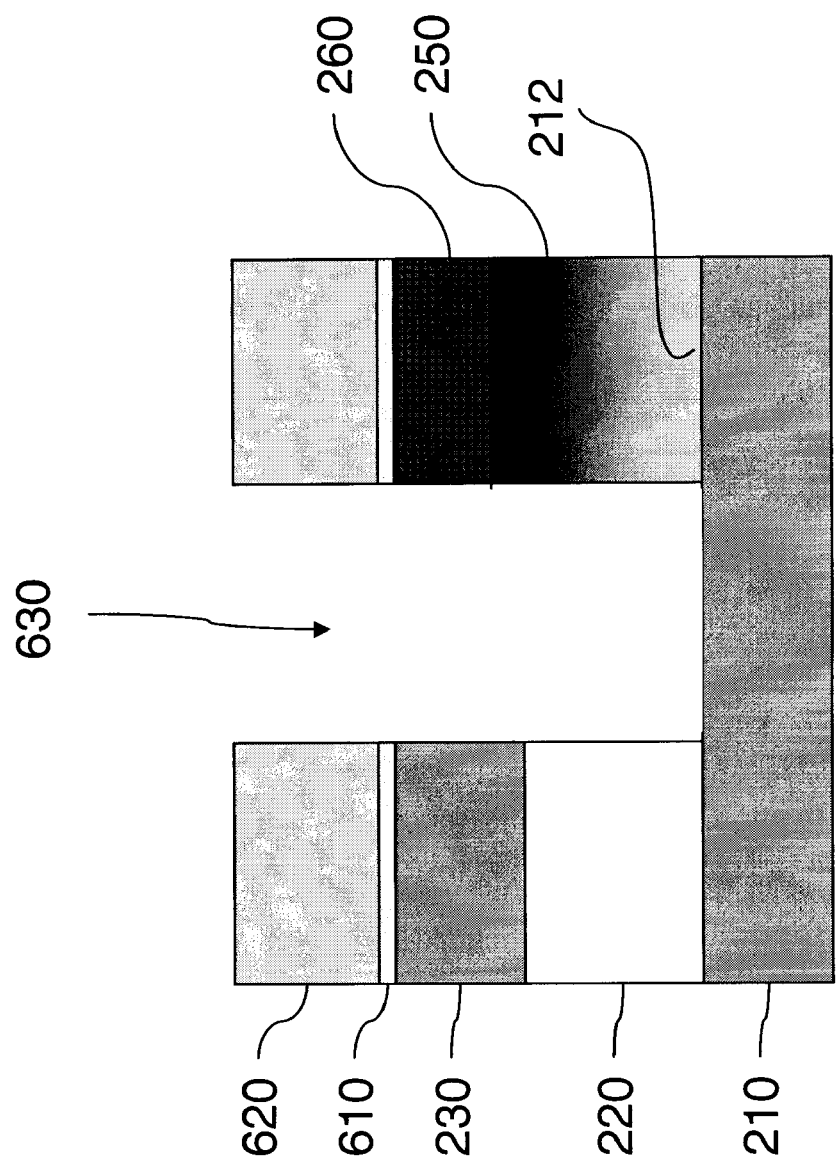
FIG. 6B illustrates a diagram of a gap.
Figure 6C:
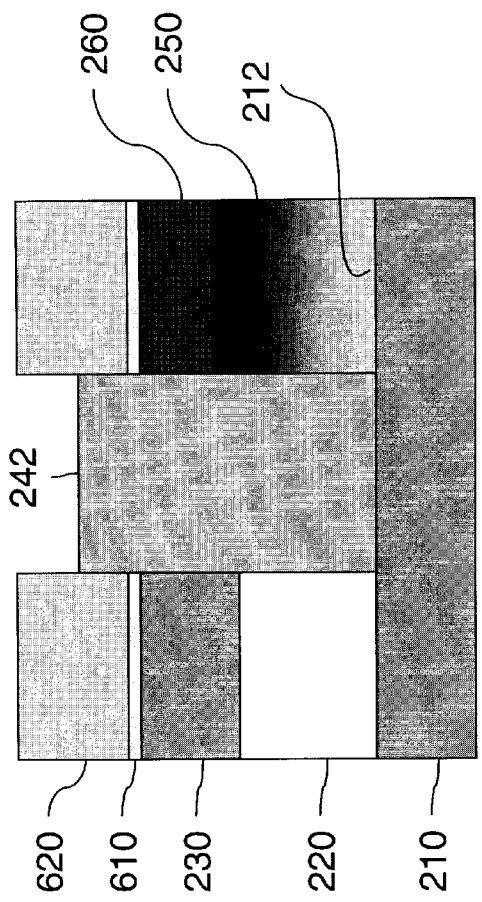
FIG. 6C illustrates a diagram of a shallow trench/field oxide region.
Figure 6D:
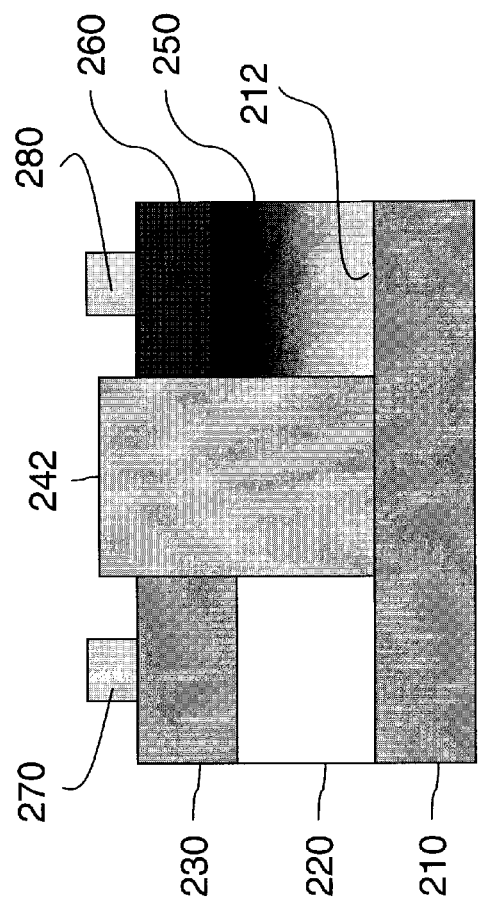
FIG. 6D illustrates a diagram of FETs proximate the shallow trench/field oxide region.

FIGS. 6A-6D illustrate a method of forming a shallow trench isolation region or a field oxide region between the third silicon layer 260 and the oxide layer 220. Specifically, as illustrated in FIG. 6A, prior to the forming of the nFET 270 and the pFET 280 (as illustrated in FIG. 5), a pad oxide layer 610 is formed over the second silicon layer 230, the spacer 240, and the third silicon layer 260. Next, a pad nitride layer 620 is formed over the pad oxide layer 610; and, resists R are placed over the pad nitride layer 620. Following this, the spacer 240 and portions of the pad nitride layer 620, the pad oxide layer 610, the second silicon layer 230, the oxide layer 220, and the third silicon layer 260 not covered by the resists R are removed to form a gap 630. The resists R are then removed (FIG. 6B). Following this, an area 242 is formed in the gap 630, wherein the area 242 comprises a shallow trench isolation region or a field oxide region (FIG. 6C). The pad nitride layer 620 and the pad oxide layer 610 are subsequently removed. Next, the nFET 270 is formed on the second silicon layer 230 and the pFET 280 is formed on the third silicon layer 260 (FIG. 6D).

Thus, the embodiments of the invention provide a device, method, etc. for enhancing hole mobility. More specifically, a semiconductor device of embodiments of the invention includes an oxide layer over a first silicon layer and a second silicon layer over the oxide layer, wherein the oxide layer is between the first silicon layer and the second silicon layer. The first silicon layer and the second silicon layer comprise the same crystalline orientation. For example, the first silicon layer 210 and the second silicon layer 230 could each comprise a <100> crystalline orientation.

A spacer is provided on the first silicon layer, wherein the spacer contacts the oxide layer, the first silicon layer, and the second silicon layer. The spacer comprises a spacer, a shallow trench isolation region, or a field oxide region. As discussed above, the spacer includes a straight first side and a curved second side.

The device further includes a graded germanium layer on the first silicon layer, wherein the graded germanium layer contacts the spacer and the first silicon layer and does not contact the oxide layer. A lower portion of the graded germanium layer comprises a higher concentration of germanium than an upper portion of the graded germanium layer, wherein a top surface of the graded germanium layer lacks germanium. As discussed above, the graded germanium layer is formed on the exposed area of the first silicon layer.

Additionally, an nFET is over the second silicon layer and a pFET is over the graded germanium layer, wherein the oxide layer is only below the nFET and is not below the pFET. The nFET and the pFET are on the same plane. The device could also include a third silicon layer over the graded germanium layer, wherein the pFET is over the third silicon layer. Thus, the third silicon layer is between the graded germanium layer and the pFET. The third silicon layer comprises strained pseudomorphic silicon. As discussed above, a layer of single-crystal material on a single-crystal substrate is provided featuring slightly different chemical composition, and hence, a slightly different lattice constant. Lattice mismatch is accommodated by strain in the film; and, thinner than a certain critical thickness ($h_c$) above which stress in the film is released by formation of dislocation.

A method is also provided comprising forming an oxide layer over a first silicon layer and forming a second silicon layer over the oxide layer such that the oxide layer is between the first silicon layer and the second silicon layer. The second silicon layer is also formed such that the second silicon layer and the first silicon layer comprise the same crystalline orientation. As discussed above, the first silicon layer and the second silicon layer could each comprise a <100> crystalline orientation.

Next, a portion of the second silicon layer and a portion of the oxide layer are removed to leave an exposed area of the first silicon layer. As discussed above, sidewalls of the second silicon layer and the oxide layer are adjacent to the exposed area of the first silicon layer, wherein the sidewall of the second silicon layer is collinear to the sidewall of the oxide layer.

Following this, a spacer is formed on the exposed area of the first silicon layer such that the spacer contacts the oxide layer, the first silicon layer, and the second silicon layer. The spacer comprises a spacer, a shallow trench isolation region, or a field oxide region. As discussed above, a first side of the spacer is on the sidewalls of the oxide layer and the second silicon layer.

The method then forms a graded germanium layer on the exposed area of the first silicon layer such that the graded germanium layer contacts the spacer and the first silicon layer. Moreover, the graded germanium layer is formed such that a lower portion of the graded germanium layer comprises a higher concentration of germanium than an upper portion of the graded germanium layer, and such that a top surface of the graded germanium layer lacks germanium. As discussed above, a first side of the graded germanium layer is on a second side of the spacer.

Subsequently, an nFET is formed over the second silicon layer and a pFET is formed over the graded germanium layer, such that the oxide layer is only below the nFET and is not below the pFET. The nFET and the pFET are formed on the same plane. The method could also include forming a third silicon layer over the graded germanium layer such that the third silicon layer comprises strained pseudomorphic silicon. As discussed above, a first side of the third silicon layer is on a second side of the spacer.

Figure 7:
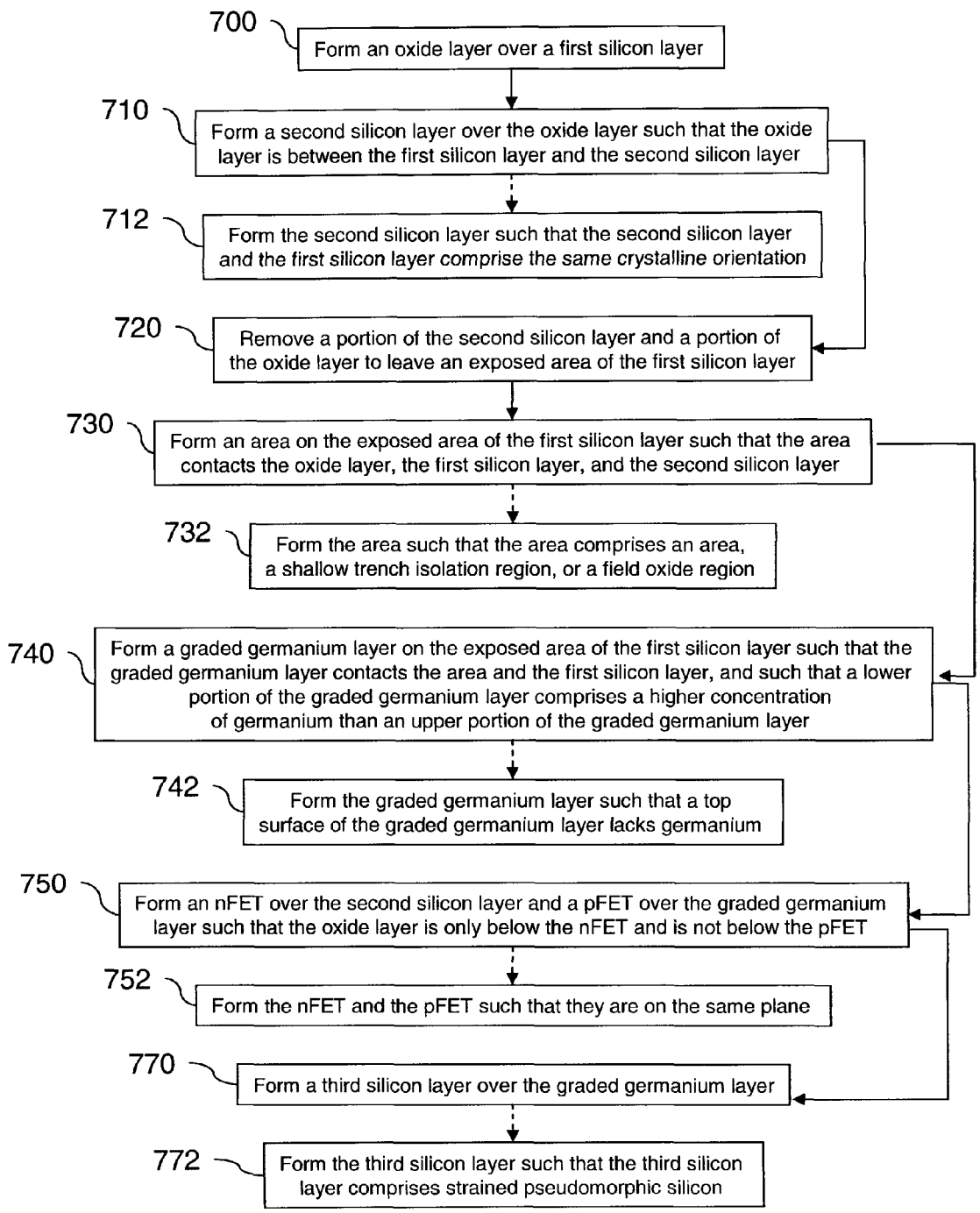
FIG. 7 illustrates a flow diagram of a method of enhancing hole mobility.

FIG. 7 illustrates a flow diagram of a method of enhancing hole mobility. The method begins by forming an oxide layer over a first silicon layer (item 700) and by forming a second silicon layer over the oxide layer such that the oxide layer is between the first silicon layer and the second silicon layer (item 710). This involves forming the second silicon layer such that the second silicon layer and the first silicon layer comprise the same crystalline orientation (item 712). As discussed above, the first silicon layer and the second silicon layer could each comprise a <100> crystalline orientation.

Next, in item 720, a portion of the second silicon layer and a portion of the oxide layer are removed to leave an exposed area of the first silicon layer. As discussed above, the removed portion of the second silicon layer could have a surface area that is equal to the surface area of the removed portion of the oxide layer.

Following this, in item 730, a spacer is formed on the exposed area of the first silicon layer such that the spacer contacts the oxide layer, the first silicon layer, and the second silicon layer. This includes, in item 732, forming the spacer such that the spacer comprises a spacer, a shallow trench isolation region, or a field oxide region. As discussed above, a height of the spacer is approximately equal to the combined height of the oxide layer and the second silicon layer.

The method then forms a graded germanium layer on the exposed area of the first silicon layer in item 740, such that the graded germanium layer contacts the spacer and the first silicon layer. The graded germanium layer is formed such that a lower portion of the graded germanium layer comprises a higher concentration of germanium than an upper portion of the graded germanium layer. Thus, in item 742, the graded germanium layer is formed such that a top surface of the graded germanium layer lacks germanium. As discussed above, a height of the graded germanium layer is approximately equal to the combined height of the oxide layer and the second silicon layer.

In item 750, an n-type field effect transistor is formed over the second silicon layer and a p-type field effect transistor is formed over the graded germanium layer such that the oxide layer is only below the n-type field effect transistor and is not below the p-type field effect transistor. This includes, in item 752, forming the n-type field effect transistor and the p-type field effect transistor such that the n-type field effect transistor and the p-type field effect transistor are on the same plane.

The method could further include, in item 770, forming a third silicon layer over the graded germanium layer. In item 772, this involves forming the third silicon layer such that the third silicon layer comprises strained pseudomorphic silicon. As discussed above, a thin layer of single-crystal silicon is provided with built-in strain (stress) to accelerate electrons, thus allowing the manufacture of faster devices.

Accordingly, the embodiments of the invention build the pFET on silicon on germanium and the nFET on the SOI substrate. Doing this will give the benefit of using a (100) crystalline-oriented SOI substrate, enhancing pFET carrier mobility and keeping the SOI benefit on nFET.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A semiconductor device, comprising:
an oxide layer over a first silicon layer;
a second silicon layer over said oxide layer, wherein said oxide layer is between said first silicon layer and said second silicon layer;
a spacer on said first silicon layer, wherein said spacer contacts said oxide layer, said first silicon layer, and said second silicon layer;
a graded germanium layer on said first silicon layer, wherein said graded germanium layer contacts said spacer and said first silicon layer, and wherein a lower portion of said graded germanium layer comprises a higher concentration of germanium than an upper portion of said graded germanium layer;
an n-type field effect transistor over said second silicon layer;
a p-type field effect transistor over said graded germanium layer; and
a third silicon layer over said graded germanium layer, wherein said third silicon layer is between said graded germanium layer and said p-type field effect transistor,
wherein said oxide layer is only below said n-type field effect transistor and is not below said p-type field effect transistor,
wherein said third silicon layer comprises strained pseudomorphic silicon,
wherein said strained pseudomorphic silicon comprises a layer of single-crystal silicon, and
wherein said third silicon layer is a lattice-mismatched heterostructure.

2. The semiconductor device according to claim 1, wherein a top surface of said graded germanium layer lacks germanium.

3. The semiconductor device according to claim 1, wherein said first silicon layer and said second silicon layer comprise the same crystalline orientation.

4. The semiconductor device according to claim 1, wherein said spacer comprises one of a spacer, a shallow trench isolation region, and a field oxide region.

5. The semiconductor device according to claim 1, wherein said n-type field effect transistor and said p-type field effect transistor are on the same plane.

6. A semiconductor device, comprising:
an oxide layer over a first silicon layer;
a second silicon layer over said oxide layer, wherein said oxide layer is between said first silicon layer and said second silicon layer;
a spacer on said first silicon layer, wherein said spacer contacts said oxide layer, said first silicon layer, and said second silicon layer;
a graded germanium layer on said first silicon layer, wherein said graded germanium layer contacts said spacer and said first silicon layer and does not contact said oxide layer, and wherein a lower portion of said graded germanium layer comprises a higher concentration of germanium than an upper portion of said graded germanium layer;
a third silicon layer over said graded germanium layer;
an n-type field effect transistor over said second silicon layer; and
a p-type field effect transistor over said third silicon layer,
wherein said oxide layer is only below said n-type field effect transistor and is not below said p-type field effect transistor,
wherein said third silicon layer comprises strained pseudomorphic silicon,
wherein said strained pseudomorphic silicon comprises a layer of single-crystal silicon, and
wherein said third silicon layer is a lattice-mismatched heterostructure.

7. The semiconductor device according to claim 6, wherein a top surface of said graded germanium layer lacks germanium.

8. The semiconductor device according to claim 6, wherein said first silicon layer and said second silicon layer comprise the same crystalline orientation.

9. The semiconductor device according to claim 6, wherein said spacer comprises one of a spacer, a shallow trench isolation region, and a field oxide region.

10. The semiconductor device according to claim 6, wherein said third silicon layer is between said graded germanium layer and said p-type field effect transistor.

11. The semiconductor device according to claim 6, wherein said n-type field effect transistor and said p-type field effect transistor are on the same plane.

* * * * *